United States Patent [19]

Bryant et al.

[11] Patent Number: 5,698,894

[45] Date of Patent: Dec. 16, 1997

[54] DOUBLE MASK HERMETIC PASSIVATION STRUCTURE

[75] Inventors: Frank Randolph Bryant, Denton; Abha Rani Singh, Carrollton, both of Tex.

[73] Assignee: SGS-Thomson Microelectronics, Inc., Carrollton, Tex.

[21] Appl. No.: 738,738

[22] Filed: Oct. 28, 1996

Related U.S. Application Data

[62] Division of Ser. No. 651,618, May 22, 1996, which is a continuation of Ser. No. 282,829, Jul. 29, 1994, abandoned.

[51] Int. Cl.$^6$ ................................................. H01L 29/34
[52] U.S. Cl. .......................... 257/629; 257/760; 257/635; 257/529; 257/665
[58] Field of Search ................................. 257/629, 635, 257/760, 529, 910, 665

[56] References Cited

U.S. PATENT DOCUMENTS

| | | | |
|---|---|---|---|
| 4,536,949 | 8/1985 | Takayama et al. | 437/922 |
| 4,628,590 | 12/1986 | Udo et al. | 437/922 |
| 4,795,720 | 1/1989 | Kawanabe et al. | 437/922 |
| 5,017,510 | 5/1991 | Welch et al. | 437/922 |
| 5,021,861 | 6/1991 | Baliga | 257/529 |
| 5,055,906 | 10/1991 | Mase et al. | 257/760 |
| 5,132,774 | 7/1992 | Matsuura et al. | 257/760 |
| 5,326,709 | 7/1994 | Moon et al. | 437/8 |
| 5,369,299 | 11/1994 | Byrne | 257/760 |
| 5,387,812 | 2/1995 | Forouhi et al. | 257/529 |
| 5,510,653 | 4/1996 | Fujiki et al. | 257/760 |
| 5,585,663 | 12/1996 | Bezama et al. | 257/529 |

FOREIGN PATENT DOCUMENTS

| | | | |
|---|---|---|---|
| 0333509 | 9/1989 | European Pat. Off. | |
| 0602271 | 2/1994 | European Pat. Off. | |
| 3937504 | 5/1990 | Germany | 437/922 |
| 0089814 | 9/1983 | Japan | 437/922 |

OTHER PUBLICATIONS

IBM Technical Disclosure Bulletin, vol. 20, No. 8, Jan. 1978, NY, U.S., pp. 3189–3190, H. Remshardt et al., "Tolerance Trimming of Electrical Data of LSI Semiconductor Circuits".

*Primary Examiner*—Tom Thomas
*Assistant Examiner*—Alexander Oscar Williams
*Attorney, Agent, or Firm*—Theodore E. Galanthay; Lisa K. Jorgenson; Christopher F. Regan

[57] ABSTRACT

A passivation structure is formed using two passivation layers and a protective overcoat layer using two masking steps. The first passivation layer is formed over the wafer and openings are provided to expose portions of the pads for testing the device and fusible links. After testing and laser repair, a second passivation layer is formed over the wafer followed a deposit of the protective overcoat. The protective overcoat is patterned and etched, exposing the pads. The remaining portions of the protective overcoat are used as a mask to remove portions of the second passivation layer overlying the pads. Leads are then attached to pads and the devices are encapsulated for packaging.

17 Claims, 3 Drawing Sheets

DOUBLE MASK HERMETIC PASSIVATION STRUCTURE

This application is a divisional of Ser. No. 08/651,618 filed on May 22, 1996 which is a continuation of Ser. No. 08/282,829 filed on Jul. 29, 1994, now abandoned.

TECHNICAL FIELD OF THE INVENTION

This invention relates in general to passivation structures, and more particularly to double mask hermetic passivation structures.

BACKGROUND OF THE INVENTION

Modern memory integrated circuits, particularly read/write circuits, such as static random access memories (SRAMS) and dynamic random access memories (DRAMs), are being quite large in physical size and in the density of memory locations therein. As the minimum feature in integrated circuit chips become smaller, the size of defect that can cause a failure shrinks accordingly. As a result, especially with large chip sizes, it is more difficult to achieve adequate manufacturing yield as the size of fatal defects diminishes. In order to reduce the vulnerability of a relatively large integrated circuit to a single, small defect, modem integrated circuits sometime utilize spare rows and columns that can replace defective rows and columns, respectively, in the memory portion of the circuit. Substitution of one of the spare rows or columns is conventionally accomplished by the opening of linking structures, such as fusible links, in decoder circuitry, so that access is made to the spare row or column upon receipt of the address for the defective row or column in the primary memory array. Conventional fuses include polysilicon fuses, which can be opened by a laser beam. Avalanche-type fuses and anti-fuses may also be used to provide the proper connections.

Examples of memory devices incorporating conventional redundancy schemes are described in Hardy, et al., "A Fault Tolerant 330NS/375 mW 16KX1 NMOS Static RAM", *J. Solid State Circuits*, Vol. SC-16, No. 5 (IEEE, 1981), pp. 435–43, and Childs, et al., "An 1818NS 4KX4 CMOS SRAM", *J. Solid State Circuits*, Vol. SC-19, No. 5 (IEEE, 1984), pp. 545–51. An example of a conventional redundancy decoder is described in U.S. Pat. No. 4,573,146, issued Feb. 25, 1986, assigned to SGS-Thomson Microelectronics, Inc., and incorporated herein by this reference. Further, a column redundancy architecture for read/write memory is described in U.S. Pat. No. 5,257,229, issued Oct. 26, 1993, assigned to SGS-Thomson Microelectronics, Inc., and incorporated herein by this reference.

In the past, three different techniques have been used primarily to form the passivation structure which protects the integrated circuit prior to encapsulation for packaging. The most secure structure uses three layers—one layer to protect the integrated circuit during testing and repair, a second layer to cover the openings formed by laser disconnect, and a third layer as a protective overcoat. This structure provides a complete hermetic sealing of the device, but is the most expensive alternative because it requires three masking levels, one associated with each of the three passivation layers.

In order to reduce the cost of the passivation structure, some manufacturers have eliminated the second passivation layer from the structure described above. While this reduces the process to two masking levels, openings formed by the laser disconnect become points of possible moisture (with mobil ion) entry as the openings are covered only by the protective overcoat, typically a polyimide. Since there is no hermetic seal, moisture can enter and contaminate the underlying integrated circuit.

A third alternative is to eliminate the masking of the integrated circuit with the first passivation layer, such that the entire surface of the integrated circuit is exposed during the test for identifying defective rows and columns. Using this method, the testing and laser disconnect steps are performed without the benefit of a protective film covering the majority of the integrated circuit, thereby subjecting the integrated circuit to contamination during this phase.

Therefore, a need has arisen in the industry for a process of providing a passivation structure which protects the integrated circuit at all times, but uses fewer masking steps.

SUMMARY OF THE INVENTION

In the present invention, a passivation structure is created over an integrated circuit by forming a first passivation layer over the integrated circuit and removing portions of the first passivation layer to expose pads and fusible links of the integrated circuit. After testing the integrated circuit and disconnecting one or more of the fusible links, a second passivation structure is formed over the surface of the integrated circuit and a protective overcoat is formed over the second passivation layer. Portions of the protective overcoats surrounding the pads are removed, thereby exposing portions of the second passivation layer. The exposed portions of the second passivation layer are removed using the protective overcoat as a mask.

The present invention provides significant advantages over the prior art. Importantly, the masking levels associated with the passivation structure are reduced over the prior art, without affecting the reliability of the devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
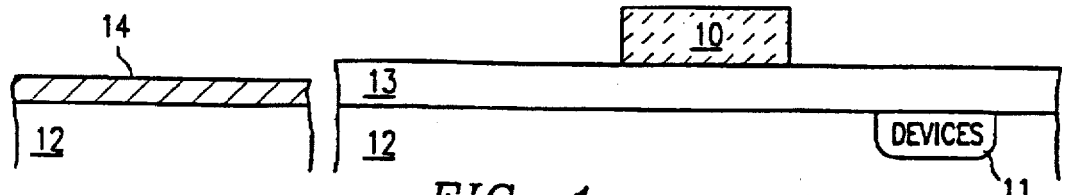
FIGS. 1a–e illustrate cross-sectional sideviews of a prior art passivation structure at first, second, third, fourth and fifth stages, respectively, using two passivation layers and a protective overcoat.

The preferred embodiment of the present invention and its advantages are best understood by referring to FIGS. 1–4 of the drawings, like numerals being used for like and corresponding parts of the various drawings.

FIGS. 1a–e illustrate five stages of the formation of a prior art passivation structure which uses two passivation layers, one formed prior to testing and one formed after laser repair, and a protective overcoat. This prior art structure requires three masking levels to form the passivation structure.

In illustrating formation of the passivation structure, steps of forming the devices on the integrated circuit are not shown. Devices (Shown generally at block 11) are formed at the surface of substrate 12 using well-known techniques. One or more interconnect layers (shown generally at layer 13) are formed to connect the devices as desired. In the initial stage shown in FIG. 1a, a metal pad 10 (generally part of one of the interconnect layers 13) is provided as a-connection to the circuitry formed on the surface of the substrate 12. A polysilicon gate 14 is formed above the substrate 12 for use as a fusible link. Although not shown to scale for illustration purposes, the polysilicon gate 14 is typically formed at a level below pad 10.

Figure 1B:
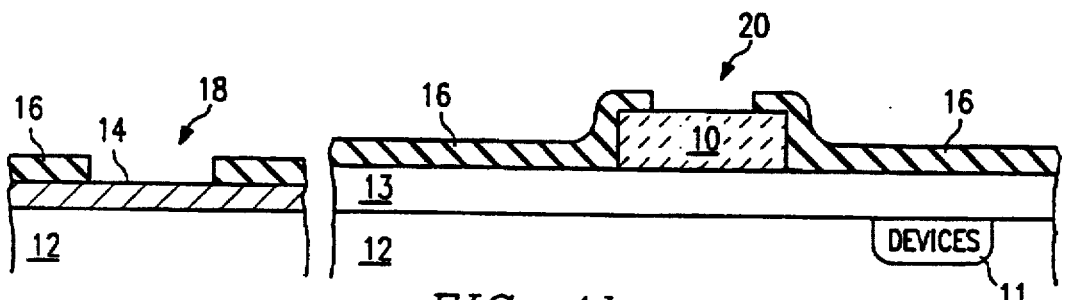

In FIG. 1b, a first passivation layer 16 is formed over the surface of the wafer. The first passivation layer 16 is etched to provide an opening 18 to the polysilicon gate 14 and an opening 20 over the pad 10. Preferably, a dielectric layer (not shown) having a thickness of 2000–8000 Angstroms is left over the polysilicon gate 14 to assist with the laser repair step described below in connection with FIG. 1c. The first passivation layer 16 may be formed, for example, by deposit of a dielectric film followed by pattern and etching to form the openings 18 and 20. The pattern and etch is the first masking step used in this process to form the passivation structure. While FIG. 1a shows a single gate 14 and pad 10, it should be noted that there are a plurality of gates 14 and pads 10 formed over the integrated circuit.

Figure 1C:
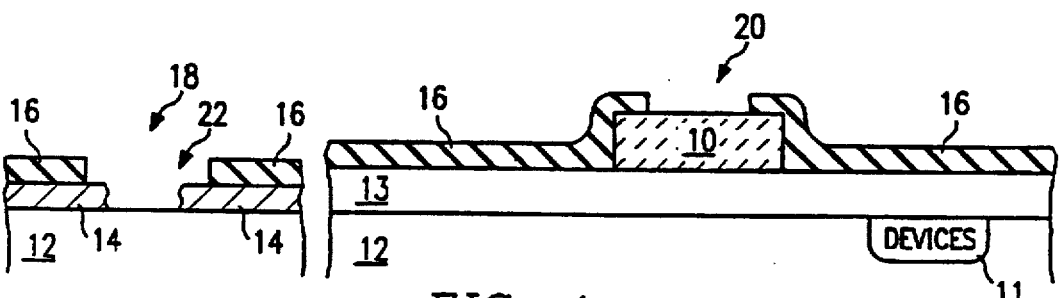

After etching to form the openings 18 and 20, the integrated circuit may be tested by probing the circuit at the pads 10. This test will determine which rows and/or columns should be disconnected to form a defect-free circuit. Once the proper rows and/or columns are detected, the associated polysilicon gates 14 are vaporized using a laser. FIG. 1c shows a disconnected portion 22 in the polysilicon gate 14.

After the laser repair step, a second passivation layer 24 is formed over the entire surface of the wafer, thereby sealing the disconnected portion 22 in the polysilicon gate 14. This layer forms a hermetic seal over all such disconnected portions 22. The second passivation layer 24 is etched to form a window 26 over the pad 10.

The second passivation layer 24 could comprise, for example, a deposited silicon nitride layer. The silicon nitride layer could be etched using a plasma etch after a masking step to expose the pads 10. This is the second masking step used in the verification of the passivation structure.

Figure 1D:
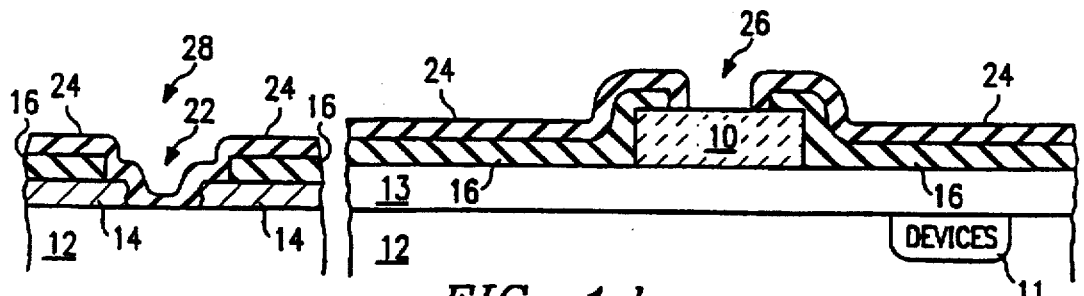
Figure 1E:
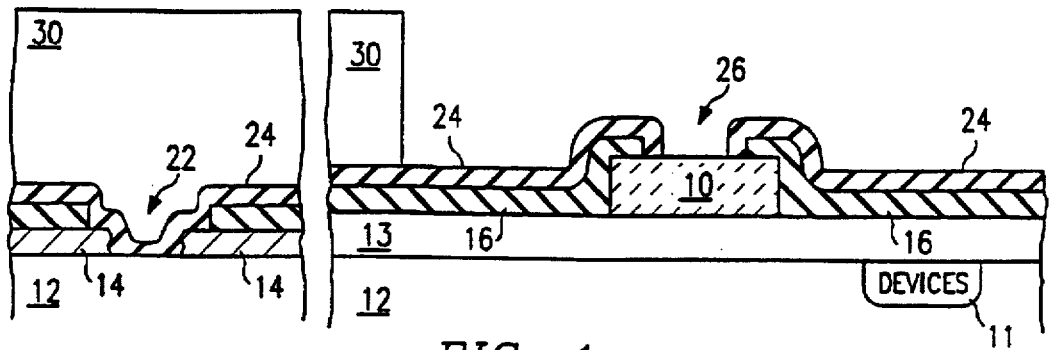

FIG. 1e illustrates a cross-sectional sideview of the passivation structure after a fifth stage wherein a protection overcoat (also referred to as a "die coat") 30 is formed over the entire wafer. The protective overcoat is patterned and etched to expose the area surrounding the pads 10. This step comprises the third masking step used in the process.

The process shown in FIGS. 1a–e is considered to be a low-risk process, since a complete hermetic seal is formed over the entire device. However, this method is expensive because of the three masking levels set forth above. In order to reduce the cost of providing the passivation structure, some manufacturers eliminate one of the two passivation layers to avoid a masking step. These structures are shown in FIGS. 2 and 3.

Figure 2:
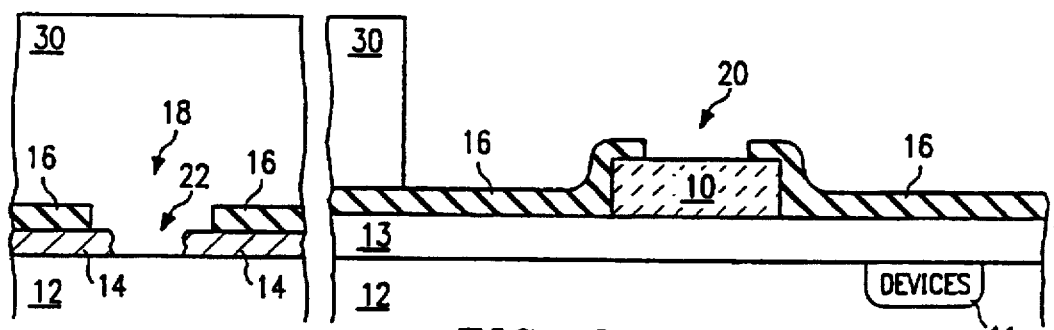
FIG. 2 illustrates a cross-sectional sideview of a prior art passivation structure using a single passivation layer formed prior to testing and a protective overcoat.

FIG. 2 illustrates a prior art structure made in the process similar to that shown in FIGS. 1a–e, except the step shown in FIG. 1d is eliminated. Consequently, the second passivation layer, which in the structure of FIGS. 1a–1e covers the disconnected portions 22 of the polysilicon gate 14 after the laser repair step, is eliminated from the structure and the protective overcoat 30 fills the disconnected portions 22. While only two masking levels are used in this process, one masking level to form the openings 18 and 20 in the first passivation layer 16 and one to pattern the protective overcoat 30, the disconnected portions 22 are not hermetically sealed. Consequently, the openings formed by laser repair in the polysilicon gate 14 are points of possible moisture entry. If polysilicon glass (PSG) is used as the first passivation layer 16, the concentration of hydroscopic phosphorus must also be limited, thereby limiting its effectiveness. In short, while this structure reduces the cost of forming passivation structure, the reliability of the resulting integrated circuit is compromised.

Figure 3:
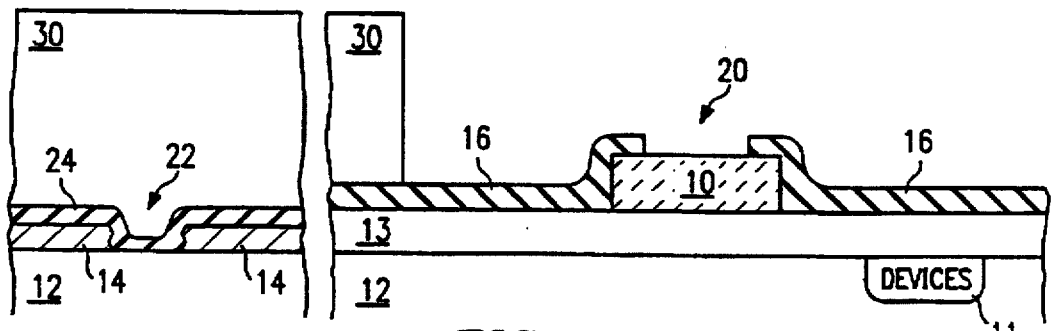
FIG. 3 illustrates a cross-sectional sideview of a prior art passivation structure using a single passivation layer formed after testing and a protective overcoat.

FIG. 3 illustrates a third prior art embodiment of forming a passivation structure in which the number of masking levels is reduced by testing the integrated circuit without the benefit of a protective layer (i.e., passivation layer 16) to protect the integrated circuit during testing. Where the testing is performed without the benefit of the protective film, yield loss can occur from a number of sources. First, if the test probes miss the pads 10 during testing, it is possible that the metal lines connecting devices on the integrated circuit will be destroyed, thereby destroying the integrated circuit. Second, even when performed in a clean room environment, the device surface may be contaminated which will introduce ionic contaminants to the surface. These contaminants decrease the reliability of the device. Third, contamination in the form of particles may form shorts between metal lines of the device. Fourth, extending the exposure time of the metal lines of the device to room humidity increases the chance of aluminum corrosion.

Hence, as described hereinabove, it is clear that in order to reduce the cost of the passivation structure shown in FIG. 1e, alternative methods have compromised the reliability of the devices.

FIGS. 4a–e illustrate cross-sectional sideviews of a passivation structure after respective stages of processing.

Figure 4A:
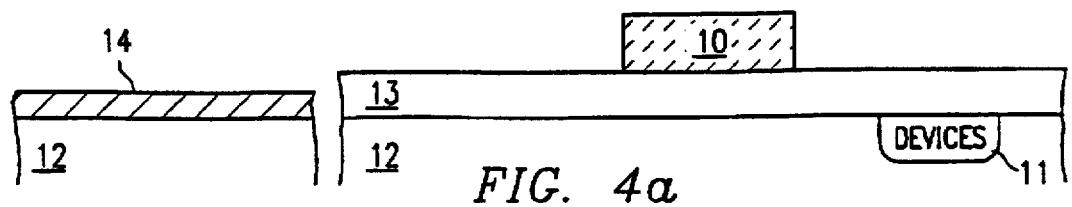
FIGS. 4a–e illustrate cross-sectional sideviews of a passivation structure at first, second, third, fourth and fifth stages, respectively, using two passivation layers and a protective overcoat, where the passivation may be formed using two masking levels.

FIG. 4a shows an initial stage wherein the polysilicon fuse 14 and pad 10 have been formed over substrate 12. As discussed in relation to FIG. 1a, in an actual integrated circuit, multiple pads and multiple fusible links would be formed on the integrated circuit. The pads 10 are connected to the devices previously formed at the face of substrate 12. Various devices are coupled through one or more interconnect layers, typically using metal layers formed over the devices (and separated therefrom by dielectric layers) and using common bitlines and wordlines formed as part of the devices.

Figure 4B:
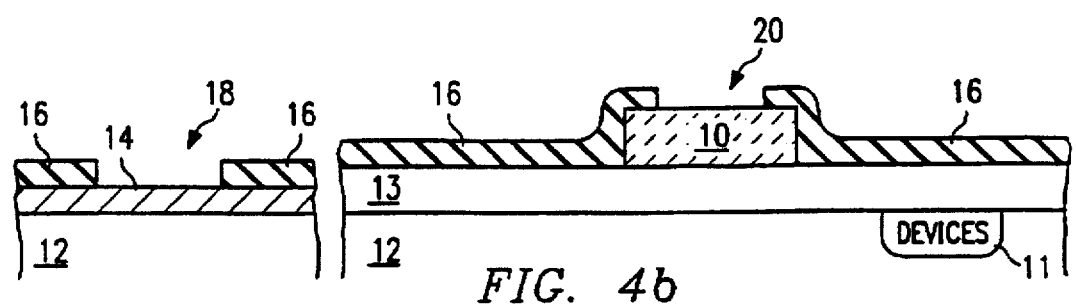
Figure 4C:
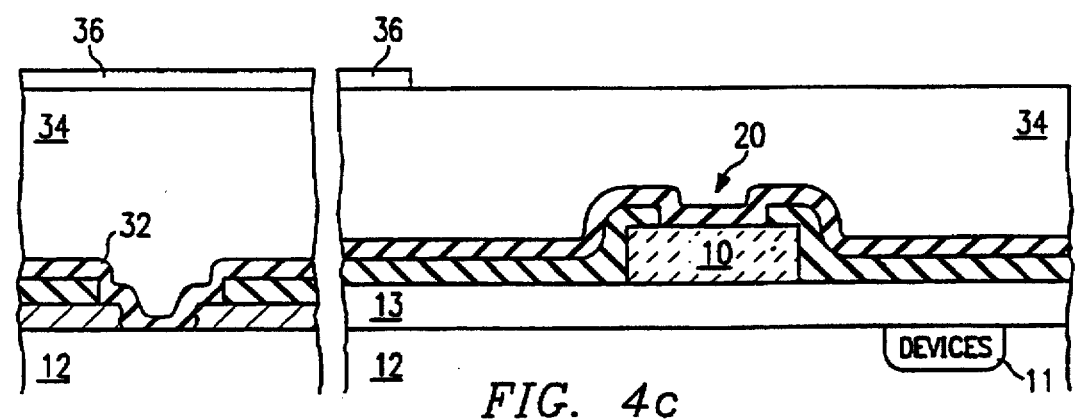

In FIG. 4b, a first passivation layer 16 is formed ever the wafer and is etched to form the openings 18 and 20, as shown in connection with FIG. 1b. The first passivation layer 16 may comprise, for example, a dielectric film of approximately 2k angstroms to 15k angstroms. The material for the passivation layer may be a silicon oxide, PSG, or silicon oxynitride ($Si_xO_yN_z$).

After formation of the first passivation layer 16, the devices on the wafer are tested to identify defective elements using well-known techniques. Thereafter, laser repair is performed by forming disconnected regions 22 in the polysilicon gate 14, as shown in connection with FIG. 1c.

After the laser repair step, a second dielectric film 32 of approximately 200–5,000 Angstroms is deposited over the surface of the wafer. This second passivation layer 32 may comprise, for example, silicon oxide, PSG, silicon oxynitride, or silicon nitride. Typically, the second passivation layer should be a different material than the first passivation layer 16, since a selective etch will be used in a later step. Alternatively, the same material could be used for both passivation layers, and a timed etch could remove the second passivation layer 32, while leaving a sufficient thickness of the first passivation layer 16.

Unlike the prior art, the second passivation layer 32 is not patterned and masked. Instead, the protective overcoat, for example, a polyimide, 34 is formed over the entire wafer. A mask 36 is patterned over the protective overcoat layer 34 using photolithographic techniques.

Figure 4D:
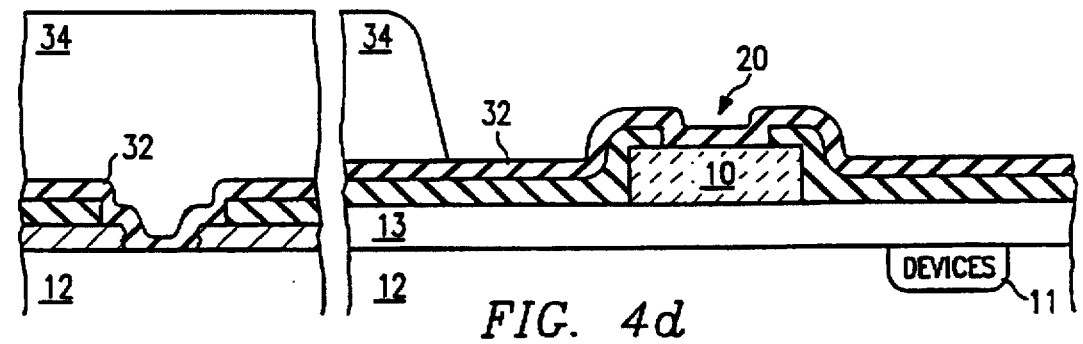

In FIG. 4d, the protective overcoat 34 is etched using an organic or other suitable etch which is selective to the second passivation layer 32. The etch removes portions of the protective overcoat surrounding the pads 10 to thereby form an opening or open area to access the second passivation layer 32.

Figure 4E:
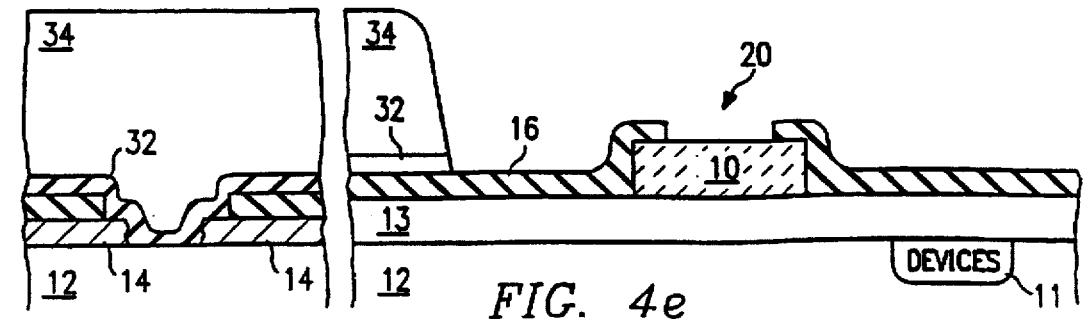

In FIG. 4e, the remaining portions of the protective overcoat 34 are used as a mask for the second passivation layer 32. Using a plasma etch, which is selective to the protective overcoat 34 and the first passivation layer 16, the portions of the second passivation layer 32 surrounding the pads 10 are removed, thereby forming an opening or exposing the opening 20 to the pad. Thereafter, the leads can be attached to the pads 10 and the integrated circuits can be encapsulated for packaging.

As can be seen by the process steps shown above, a passivation structure is shown with complete hermetic sealing by using two passivation layers and a protective overcoat layer, performed using only two masking steps. Consequently, the cost of producing the passivation structure is reduced without affecting the reliability of the underlying devices.

Although the present invention and its advantages have been described in detail, it should be understood that various changes, substitutions and alterations can be made herein without departing from the spirit and scope of the invention as defined by the appended claims.

What is claimed is:

1. An integrated circuit comprising:
   a substrate;
   a plurality of devices in said substrate;
   a plurality of linking structures linking said plurality of devices, at least one of said plurality of linking structures being altered to a disconnected state;
   a plurality of contact pads on said substrate;
   a plurality of interconnects coupling ones of said plurality of devices and said plurality of contact pads;
   a first passivation layer on said substrate and having first openings exposing said plurality of contact pads and second openings exposing said plurality of linking structures;
   a second non-masked passivation layer on said first passivation layer and covering the second openings of said first passivation layer, said second non-masked passivation layer having third openings therein aligned with the first openings of said first passivation layer thereby exposing said plurality of contact pads; and
   a third passivation layer covering said second non-masked passivation layer and having fourth openings therein aligned with the third openings of said second non-masked passivation layer and the first openings of said first passivation layer thereby exposing said plurality of contact pads.

2. An integrated circuit according to claim 1 wherein said third passivation layer is an outermost passivation layer.

3. An integrated circuit according to claim 1 wherein said first passivation layer comprises one of silicon dioxide, polysilicon glass, and silicon oxynitride.

4. An integrated circuit according to claim 1 wherein said first passivation layer has a thickness in the range of about 2,000 to 15,000 Angstroms.

5. An integrated circuit according to claim 1 wherein said second passivation layer comprises a different material than said first passivation layer.

6. An integrated circuit according to claim 1 wherein said second passivation layer comprises one of silicon dioxide, polysilicon glass, silicon nitride, and silicon oxynitride.

7. An integrated circuit according to claim 1 wherein said linking structures each comprises polysilicon.

8. An integrated circuit according to claim 1 wherein said interconnects comprise metal.

9. An integrated circuit according to claim 1 wherein said devices and said interconnects define a memory circuit.

10. An integrated circuit comprising:
    a substrate;
    a plurality of devices in said substrate;
    a plurality of linking structures linking said plurality of devices, at least one of said plurality of linking structures being altered to a disconnected state;
    a plurality of contact pads on said substrate;
    a plurality of interconnects coupling ones of said plurality of devices and said plurality of contact pads;
    a first passivation layer on said substrate and having first openings exposing said plurality of contact pads and second openings exposing said plurality of linking structures;
    a second non-masked passivation layer on said first passivation layer and covering the second openings of said first passivation layer, said second non-masked passivation layer having third openings therein aligned with the first openings of said first passivation layer thereby exposing said plurality of contact pads, said second non-masked passivation layer comprising a material different than said first passivation layer; and
    a third and outermost passivation layer covering said second non-masked passivation layer and having fourth openings therein aligned with the third openings of said second non-masked passivation layer and the first openings of said first passivation layer thereby exposing said plurality of contact pads.

11. An integrated circuit according to claim 10 wherein said first passivation layer comprises one of silicon dioxide, polysilicon glass, and silicon oxynitride.

12. An integrated circuit according to claim 10 wherein said first passivation layer has a thickness in the range of about 2,000 to 15,000 Angstroms.

13. An integrated circuit according to claim 10 wherein said second passivation layer comprises one of silicon dioxide, polysilicon glass, silicon nitride and silicon oxynitride.

14. An integrated circuit according to claim 10 wherein said linking structures each comprises polysilicon.

15. An integrated circuit according to claim 10 wherein said interconnects comprise metal.

16. An integrated circuit according to claim 10 wherein said first passivation layer comprises one of silicon dioxide, polysilicon glass, and silicon oxynitride.

17. An integrated circuit according to claim 10 wherein said devices and said interconnects define a memory circuit.

* * * * *